United States Patent
Kurokawa et al.

(10) Patent No.: US 7,273,818 B2
(45) Date of Patent: Sep. 25, 2007

(54) FILM FORMATION METHOD AND APPARATUS FOR SEMICONDUCTOR PROCESS

(75) Inventors: Masaki Kurokawa, Tokyo (JP); Norifumi Kimura, Tokyo (JP); Takehiko Fujita, Tokyo (JP); Yoshikazu Furusawa, Tokyo (JP); Katsuhiko Komori, Tokyo (JP); Kazuhide Hasebe, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 10/965,819

(22) Filed: Oct. 18, 2004

(65) Prior Publication Data

US 2005/0170617 A1    Aug. 4, 2005

(30) Foreign Application Priority Data

Oct. 20, 2003    (JP)    ............................. 2003-359633

(51) Int. Cl.
*H01L 21/20* (2006.01)
*H01L 21/36* (2006.01)

(52) U.S. Cl. .............. 438/761; 257/E21.092; 257/E21.102; 438/483

(58) Field of Classification Search ................ 438/761, 438/483; 257/E21.092, E21.102
See application file for complete search history.

(56) References Cited

U.S. PATENT DOCUMENTS

| 5,851,904 A | * | 12/1998 | Schwarz et al. | ............ 438/482 |
| 6,562,736 B2 | * | 5/2003 | Yanagawa et al. | .......... 438/795 |
| 2004/0058482 A1 | * | 3/2004 | Yoshida et al. | ............. 438/149 |

FOREIGN PATENT DOCUMENTS

| JP | 2002-305256 | 10/2002 |
| JP | 2003-77845 | 3/2003 |

* cited by examiner

*Primary Examiner*—Caridad Everhart
(74) *Attorney, Agent, or Firm*—Oblon, Spivak, McClelland, Maier & Neustadt, P.C.

(57) ABSTRACT

In a film-formation method for a semiconductor process, a silicon germanium film is formed on a target substrate by CVD in a process field within a reaction container. Then, a silicon coating film is formed to cover the silicon germanium film by CVD in the process field, while increasing temperature of the process field from the first temperature to a second temperature. Then, a silicon film is formed on the coating film by CVD in the process field.

16 Claims, 8 Drawing Sheets

FILM FORMATION METHOD AND APPARATUS FOR SEMICONDUCTOR PROCESS

CROSS-REFERENCE TO RELATED APPLICATIONS

This application is based upon and claims the benefit of priority from prior Japanese Patent Application No. 2003-359633, filed Oct. 20, 2003, the entire contents of which are incorporated herein by reference.

BACKGROUND OF THE INVENTION

1. Field of the Invention

The present invention relates to a film-formation method and apparatus for a semiconductor process, which are used for forming a film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

Conventionally, for example, poly-silicon is used for gate electrodes of transistors. Gate electrodes of poly-silicon can be easily depleted, when supplied with a bias voltage. As the thickness of gate insulating films decreases, this becomes prominent, which is one of the causes of device properties being deteriorated. In order to solve this problem, it has been studied to employ silicon germanium, which has a higher dopant activation rate, in place of silicon. For example, Jpn. Pat. Appln. KOKAI Publication No. 2003-77845 (patent publication 1: see FIG. 1 and Paragraph 17) discloses a method for forming a silicon germanium film on the surface of a semiconductor wafer. This method employs a vertical heat-processing apparatus, which supplies mono-silane ($SiH_4$) gas and mono-germane ($GeH_4$) gas to form a silicon germanium film by CVD.

Where a gate insulating film is formed of a silicon oxide film, and a silicon germanium film is to be formed on the surface of the silicon oxide film, film-formation hardly occurs at the initial stage. The silicon germanium film, however, shows a sudden deposition after a certain time, using germanium sticking points as footholds. This makes it difficult to provide the silicon germanium film with a uniform thickness. In order to solve this problem, a technique is known in which a seed film of amorphous silicon or poly-silicon is formed to have a small thickness of, e.g., 5 nm to 10 nm on a silicon oxide film, and then a silicon germanium film is formed on the seed film.

After the silicon germanium film is formed, the silicon germanium film is doped with an impurity element, such as phosphorous or boron. Then, a cobalt film is formed on the surface of the silicon germanium film by sputtering, and is heat-processed to form a silicide (i.e., a silicon-metal compound is produced). At this time, if the cobalt film is directly formed on the silicon germanium film, germanium is taken into the silicide film and deteriorates the properties of the transistor. For this reason, a cap film consisting of a poly-silicon film or amorphous silicon film is formed on the surface of the silicon germanium film, and then the cobalt film is formed on the cap film.

BRIEF SUMMARY OF THE INVENTION

An object of the present invention is to provide a film-formation apparatus and film-formation method of this kind, which improve electrical properties of semiconductor devices using a silicon germanium film or amorphous silicon film.

According to a first aspect of the present invention, there is provided a film-formation method for a semiconductor process, comprising:

forming a silicon germanium film on a target substrate by CVD in a process field within a reaction container, while setting the process field at a first temperature, and supplying a first process gas of a silane family and a second process gas of a germane family into the process field, then, forming a silicon coating film to cover the silicon germanium film by CVD in the process field, while increasing temperature of the process field from the first temperature to a second temperature, supplying the first process gas into the process field, and stopping supply of the second process gas; and then, forming a silicon film on the coating film by CVD in the process field, while setting the process field at the second temperature, supplying the first process gas into the process field, and stopping supply of the second process gas.

According to a second aspect of the present invention, there is provided a film-formation apparatus for a semiconductor process, comprising:

a reaction container having a process field configured to accommodate a target substrate;

a heater configured to heat the process field;

an exhaust system configured to exhaust the reaction container;

a first gas supply circuit configured to supply a first process gas of a silane family into the reaction container;

a second gas supply circuit configured to supply a second process gas of a germane family into the reaction container; and a control section configured to control an operation of the apparatus, wherein the control section executes forming a silicon germanium film on the target substrate by CVD in the process field, while setting the process field at a first temperature, and supplying the first and second process gases into the process field, then, forming a silicon coating film to cover the silicon germanium film by CVD in the process field, while increasing temperature of the process field from the first temperature to a second temperature, supplying the first process gas into the process field, and stopping supply of the second process gas; and then, forming a silicon film on the coating film by CVD in the process field, while setting the process field at the second temperature, supplying the first process gas into the process field, and stopping supply of the second process gas.

According to a third aspect of the present invention, there is provided a computer readable medium containing program instructions for execution on a processor, which, when executed by the processor, cause a film-formation apparatus for a semiconductor process to execute forming a silicon germanium film on a target substrate by CVD in a process field within a reaction container, while setting the process field at a first temperature, and supplying a first process gas of a silane family and a second process gas of a germane family into the process field, then, forming a silicon coating film to cover the silicon germanium film by CVD in the process field, while increasing temperature of the process field from the first temperature to a second temperature, supplying the first process gas into the process field, and stopping supply of the second process gas; and then, forming a silicon film on the coating film by CVD in the process field, while setting the process field at the second temperature, supplying the first process gas into the process field, and stopping supply of the second process gas.

According to a fourth aspect of the present invention, there is provided a film-formation method for a semiconductor process, comprising:

forming a silicon germanium film on a target substrate by CVD in a process field within a reaction container, while setting the process field at a first temperature, and supplying a first process gas of a silane family and a second process gas of a germane family into the process field, then, annealing the silicon germanium film in the process field, while supplying hydrogen gas into the process field, and stopping supply of the first and second process gases;

then, alternately performing vacuum-exhaust of the process field and purging thereof with a purge gas; and then, unloading the target substrate from the reaction container.

According to a fifth aspect of the present invention, there is provided a film-formation apparatus for a semiconductor process, comprising:

a reaction container having a process field configured to accommodate a target substrate;

a heater configured to heat the process field;

an exhaust system configured to exhaust the reaction container;

a first gas supply circuit configured to supply a first process gas of a silane family into the reaction container;

a second gas supply circuit configured to supply a second process gas of a germane family into the reaction container;

a hydrogen gas supply circuit configured to supply hydrogen gas into the reaction container;

a purge gas supply circuit configured to supply a purge gas into the reaction container; and a control section configured to control an operation of the apparatus, wherein the control section executes forming a silicon germanium film on the target substrate by CVD in the process field, while setting the process field at a first temperature, and supplying the first and second process gases into the process field, then, annealing the silicon germanium film in the process field, while supplying hydrogen gas into the process field, and stopping supply of the first and second process gases; and then, alternately performing vacuum-exhaust of the process field and purging thereof with the purge gas.

According to a sixth aspect of the present invention, there is provided a computer readable medium containing program instructions for execution on a processor, which, when executed by the processor, cause a film-formation apparatus for a semiconductor process to execute forming a silicon germanium film on a target substrate by CVD in a process field within a reaction container, while setting the process field at a first temperature, and supplying a first process gas of a silane family and a second process gas of a germane family into the process field, then, annealing the silicon germanium film in the process field, while supplying hydrogen gas into the process field, and stopping supply of the first and second process gases;

then, alternately performing vacuum-exhaust of the process field and purging thereof with a purge gas; and then, unloading the target substrate from the reaction container.

According to a seventh aspect of the present invention, there is provided a film-formation method for a semiconductor process, comprising:

forming an amorphous silicon film on a target substrate by CVD in a process field within a reaction container, while setting the process field at a first temperature, and supplying a process gas of a silane family into the process field, then, annealing the amorphous silicon film in the process field, while decreasing temperature of the process field from the first temperature, supplying hydrogen gas into the process field, and stopping supply of the process gas;

then, alternately performing vacuum-exhaust of the process field and purging thereof with a purge gas; and then, unloading the target substrate from the reaction container.

According to an eighth aspect of the present invention, there is provided a computer readable medium containing program instructions for execution on a processor, which, when executed by the processor, cause a film-formation apparatus for a semiconductor process to execute forming an amorphous silicon film on a target substrate by CVD in a process field within a reaction container, while setting the process field at a first temperature, and supplying a process gas of a silane family into the process field, then, annealing the amorphous silicon film in the process field, while decreasing temperature of the process field from the first temperature, supplying hydrogen gas into the process field, and stopping supply of the process gas;

then, alternately performing vacuum-exhaust of the process field and purging thereof with a purge gas; and then, unloading the target substrate from the reaction container.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of preferred the embodiments given below, serve to explain the principles of the invention.

DETAILED DESCRIPTION OF THE INVENTION

In the process of developing the present invention, the inventors studied problems related to conventional methods for forming a gate structure with a gate electrode comprising a silicon film or silicon germanium film. As a result, the inventors have arrived at the findings given below.

Where a silicon germanium film is formed, and then a cap film consisting of a poly-silicon film or amorphous silicon film is formed on the surface thereof, the process temperature for the silicon germanium film is around 500° C., and the process temperature for the cap film is around 600° C. Accord-ingly, in order to form the cap film, the temperature of a process field needs to be increased to the process temperature for the cap film after the silicon germanium film is formed. However, since germanium is thermally unstable, migration (a phenomenon in which atoms move) is caused in the silicon germanium film 13, thereby bringing about the following problems.

Figure 10:
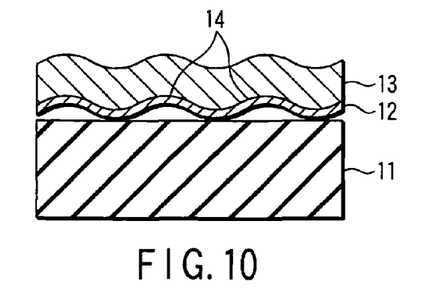
FIG. 10 is a view for explaining a state of migration being caused in a silicon germanium film according to a conventional film-formation method.

FIG. 10 is a view for explaining a state of migration being caused in a silicon germanium film according to a conventional film-formation method. Where migration occurs, the surface of the silicon germanium film 13 becomes rough. Further, as shown in FIG. 10, as the thickness of the silicon germanium film is smaller, the backside of the film becomes wavy together with the seed film 12. In this case, voids 14 are formed between the silicon oxide film 11, i.e., the gate insulating film, and the seed film 12. As a consequence, the leakage current increases, so the properties of the transistor are deteriorated, and the yield is reduced.

For a case where a silicon germanium film is used as a gate electrode, a structure with no cap film has also been studied. Further, a method called cycle purge is used as a method of replacing a process gas in a reaction container with an inactive gas, after a film-formation process is finished in the reaction container. This cycle purge is a step of cyclical several repetitions of vacuum-exhausting the reaction container, and then supplying the inactive gas thereinto. Where such a step is performed after a silicon germanium film is formed on a substrate, migration may be caused in the silicon germanium film and bring about a problem similar to that described above, when the reaction container is exhausted to a very low pressure by a vacuum pump at full load (with the pressure regulation valve at full admission). Furthermore, where an amorphous silicon film is used as an electrode film, migration may be also caused in the amorphous silicon film and increase the leakage current, when cycle purge is performed after the amorphous silicon film is formed.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 1:
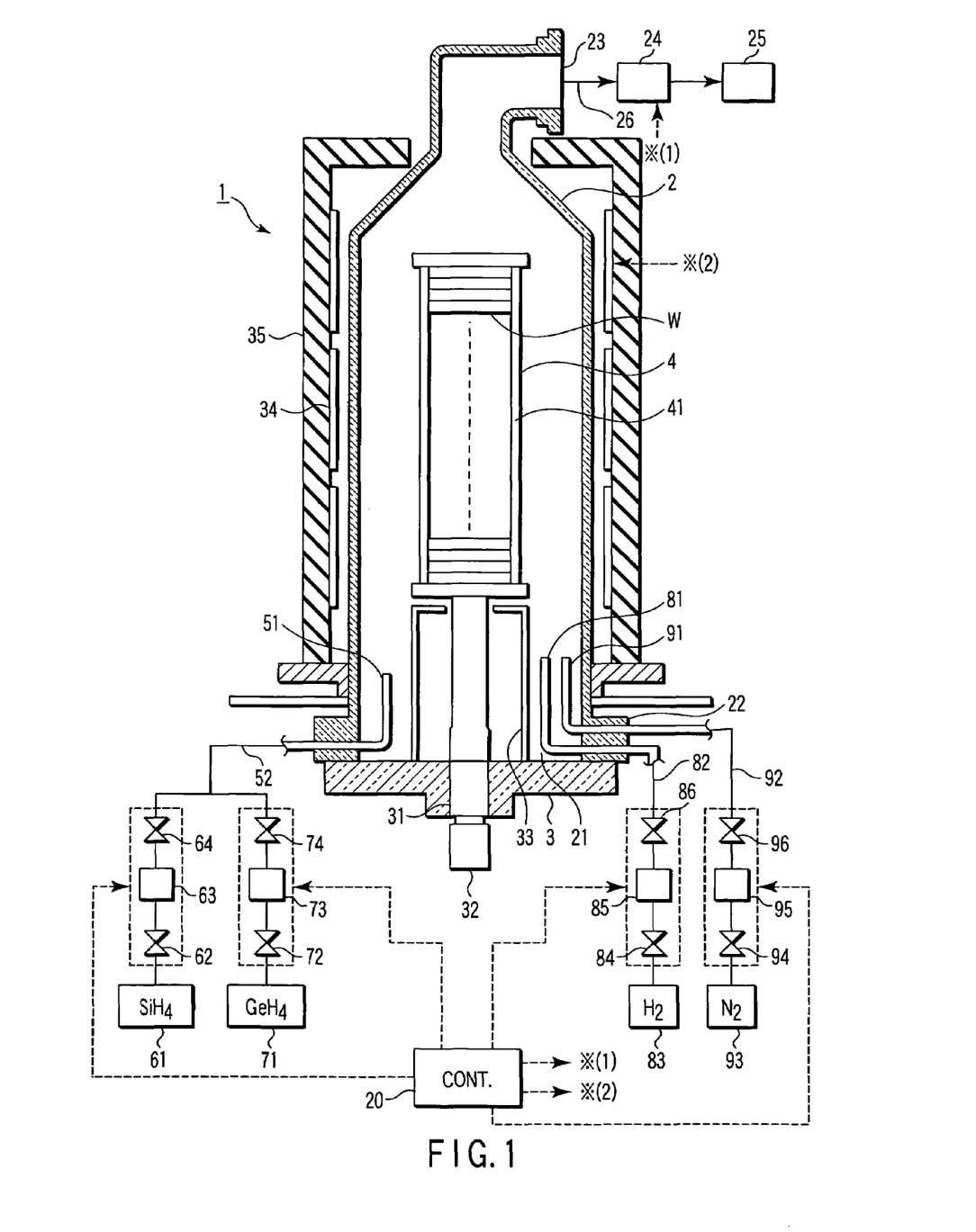
FIG. 1 is a structural view showing a vertical heat-processing apparatus according to an embodiment of the present invention.

FIG. 1 is a structural view showing a vertical heat-processing apparatus according to an embodiment of the present invention. As shown in FIG. 1, the heat-processing apparatus (film-formation apparatus) 1 includes a cylindrical reaction container 2, which is made of, e.g., quartz and directed vertically. The reaction container 2 is opened at the bottom to form a load port 21, around which a flange 22 is integrally formed. A lid 3 made of, e.g., quartz is disposed below the reaction container 2, so that the lid 3 can come into contact with the bottom of the flange 22 to airtightly close the port 21. The lid 3 is moved up and down by a boat elevator (not shown) to open and close the port. A rotary shaft 31 extends through the center of the lid 3, and supports a substrate holder or wafer boat 4 at the top.

The wafer boat 4 includes three or more, e.g. four, struts 41. The struts 41 have grooves (slots) to support a plurality of, e.g., 125, target substrates or semiconductor wafers W stacked at intervals. The 125 wafers W consist of dummy wafers disposed at the top and bottom sides, and product wafers placed therebetween. The bottom of the rotary shaft 31 is connected to a motor 32 for rotating the rotary shaft 31, so that the wafer boat 4 is rotated by the motor 32. A heat-insulating unit 33 is disposed on the lid 3 and surrounds the rotary shaft 31.

Injectors 51, 81, and 91 each having an L-shape are disposed to extend through the flange 22 at the bottom of the reaction container 2, and are used to supply gases onto the wafers W within the reaction container 2. The proximal end of the injector 51 is connected to a gas supply section by a gas supply line 52. The proximal end of the gas supply line 52 is divided into two circuits. One of the circuits is provided with a supply source 61 of a silane family gas, such as mono-silane ($SiH_4$) gas, a valve 62, a flow regulator or mass-flow controller 63, and a valve 64 disposed thereon in this order from the upstream side. The other of the circuits is provided with a supply source 71 of a germane family gas, such as mono-germane ($GeH_4$) gas, a valve 72, a flow regulator or mass-flow controller 73, and a valve 74 disposed thereon in this order from the upstream side. The supply source 71 of mono-germane gas is a source for supplying mono-germane gas diluted to 10% by, e.g., hydrogen gas.

The valve 62, mass-flow controller 63, valve 64, gas supply line 52, and injector 51 constitute a first gas supply circuit for supplying a silane family gas into the reaction container 2. The valve 72, mass-flow controller 73, valve 74, gas supply line 52, and injector 51 constitute a second gas supply circuit for supplying a germane family gas into the reaction container 2. In this embodiment, the first gas supply circuit and second gas supply circuit share the gas supply line 52 and injector 51.

The proximal end of the injector 81 is connected to a gas supply section by a gas supply line 82. The proximal end of the gas supply line 82 is provided with a hydrogen ($H_2$) gas supply source 83, a valve 84, a mass-flow controller 85, and a valve 86 disposed thereon in this order from the upstream side. The valve 84, mass-flow controller 85, valve 86, gas supply line 82, and injector 81 constitute a third gas supply circuit for supplying a hydrogen gas into the reaction container 2.

The proximal end of the injector 91 is connected to a gas supply section by a gas supply line 92. The proximal end of the gas supply line 92 is provided with a nitrogen gas supply source 93, a valve 94, a mass-flow controller 95, and a valve 96 disposed thereon in this order from the upstream side. The valve 94, mass-flow controller 95, valve 96, gas supply line 92, and injector 91 constitute a fourth gas supply circuit for supplying a purge gas, such as nitrogen gas, into the reaction container 2.

An exhaust port 23 is formed at the top of the reaction container 2 to exhaust the interior of the reaction container 2. The exhaust port 23 is connected to an exhaust line 26 provided with a vacuum pump 25 and pressure regulator 24 to vacuum-exhaust the interior of the reaction container 2 to a desired vacuum level. A furnace 35 is disposed around the reaction container 2, and includes a heater 34 for heating up the interior of the reaction container 2. The heater 34 is formed of a carbon wire heater, which allows a process to be performed with least contamination, i.e., at high cleanness, and allows temperature to be quickly increased and decreased.

Further, the film-formation apparatus 1 includes a control section 20 formed of a computer. The control section 20 is configured to activate a process program and read the description of a process recipe stored in a storage section (described later), so as to control the process conditions in accordance with the recipe. The control section 20 outputs control signals to respectively control the heater 34, pressure regulator 24, and gas supply devices (such as valves, mass-flow controllers, etc.) of the gas supply section.

Figure 2:
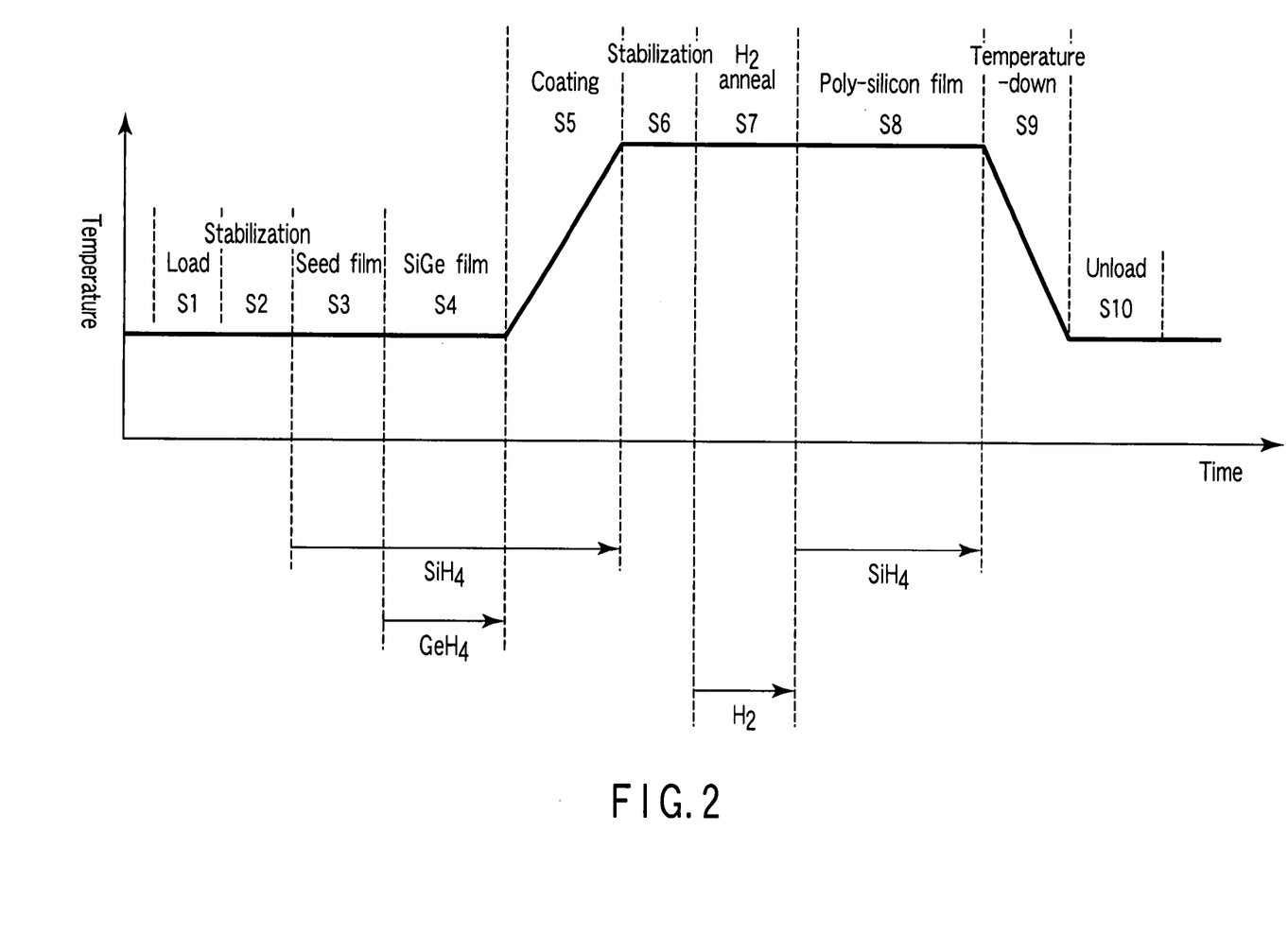
FIG. 2 is a view showing the temperature profile, steps, and feed process gases of a film-formation method according to a first embodiment of the present invention.

Next, with reference to FIGS. 2 to 4, an explanation will be given of a film-formation method according to a first embodiment of the present invention, performed in the film-formation apparatus 1 described above. FIG. 2 is a view showing the temperature profile, steps, and feed process gases of a film-formation method according to the first embodiment of the present invention. FIGS. 3A to 3E are sectional views of a wafer, showing sequential steps of the film-formation method shown in FIG. 2. FIG. 4 is a view for explaining a state of migration in a silicon germanium film being suppressed by silicon deposited on the film.

Figure 3A:
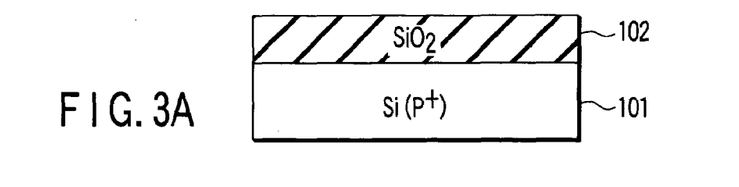
FIGS. 3A to 3E are sectional views of a wafer, showing sequential steps of the film-formation method shown in FIG. 2.
Figure 4:
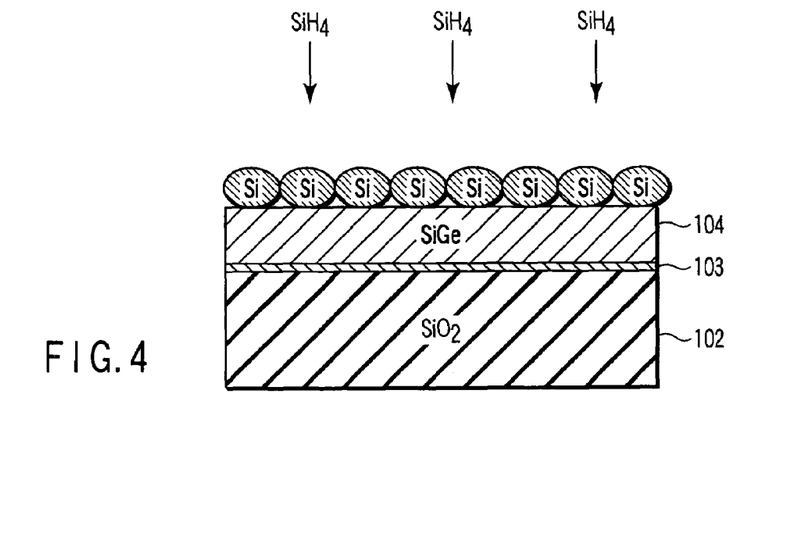
FIG. 4 is a view for explaining a state of migration in a silicon germanium film being suppressed by silicon deposited on the film.

First, as shown in FIG. 3A, silicon wafers W are prepared such that they include an N-type or P-type silicon layer 101 and a silicon oxide film ($SiO_2$) 102 used as an insulating film formed on the surface of the layer 101. A predetermined number of such wafers W are placed and stacked at intervals on a wafer boat 4, and the wafer boat 4 is then moved up by the boat elevator (not shown). With this operation, the wafer boat 4 is loaded into the reaction container 2, and the bottom port of the flange 22 is closed by the lid 3 (step S1). Then, the process field within the reaction container 2, in which the wafer boat 4 is placed, is heated at a process temperature of, e.g., from 470 to 550° C. (step S2).

Figure 3B:
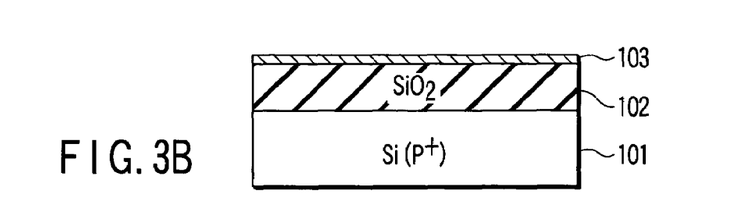

After the process field within the reaction container 2 is stabilized at the process temperature, mono-silane gas is supplied at a predetermined flow rate into the reaction container 2 from the mono-silane gas supply source 61 through the supply port at the top of the injector 51 (supply of mono-germane gas is stopped). Further, the interior of the reaction container 2 is exhausted, and is maintained at a predetermined pressure (vacuum level) by the pressure regulator 24. By doing so, as shown in FIG. 3B, a seed film 103 made of silicon (Si) is formed to a film thickness of, e.g., from about 5 nm to 10 nm, on the surface of the silicon oxide film 102 (step S3).

It should be noted that the interior of the reaction container 2 is kept exhausted from this step to an unload step S10.

Figure 3C:
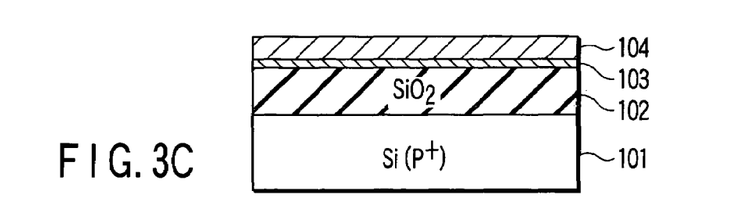

Then, mono-germane gas is supplied from the mono-germane gas supply source 71, while mono-silane gas is kept supplied, so as to supply a mixture gas of mono-silane gas and mono-germane gas into the reaction container 2 through the supply port at the top of the injector 51. At this time, the flow rates of mono-silane gas and mono-germane gas are set at, e.g., 1000 sccm and 1000 sccm, respectively. The mono-silane gas and mono-germane gas thus supplied into the reaction container 2 react with each other by thermal decomposition, and a silicon germanium film 104 is thereby formed on the seed film 103, as shown in FIG. 3C (step S4).

Figure 3D:
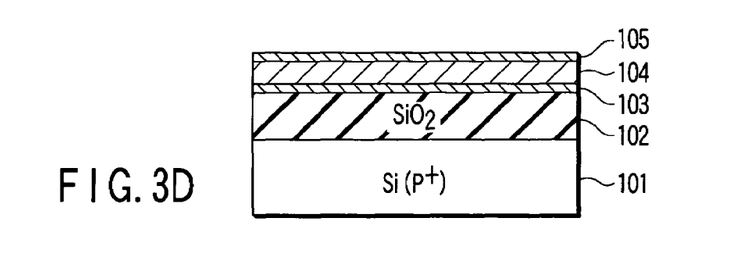

Then, the valve 74 is closed to stop only supply of mono-germane gas, and mono-silane gas is supplied at, e.g., 500 sccm into the reaction container 2, while the pressure within the reaction container 2 is maintained at, e.g., 10 Pa. Further, the heater 34 is controlled so that the temperature of the process field within the reaction container 2 is increased to a second temperature of, e.g., 530 to 620° C. (step S5). In this embodiment, the film-formation temperature for the silicon germanium film corresponds to a first temperature. In this temperature increase step, mono-silane gas is thus supplied into the reaction container 2, so that a coating film 105 made of silicon is formed to a film thickness of, e.g., about 5 to 10 nm on the surface of the silicon germanium film 104, as shown in FIG. 3D.

Then, the valve 64 is closed to stop supply of mono-silane gas, and the temperature within the reaction container 2 is stabilized (step S6). However, mono-silane gas may be kept supplied during this temperature stabilization step. Then, hydrogen gas is supplied at a flow rate of, e.g., from 100 to 1000 sccm into the reaction container 2 from the hydrogen gas supply source 82 through the supply port at the top of the injector 81 (supply of mono-silane gas and mono-germane gas is stopped). By doing so, the interior of the reaction container 2 is maintained at a predetermined vacuum atmosphere, and the surface of the coating film 105 is annealed (step S7). The surface of the coating film 105 is annealed by hydrogen gas, so that migration in the silicon coating film 105 is prevented, while the temperature within the reaction container 2 is stabilized.

Figure 3E:
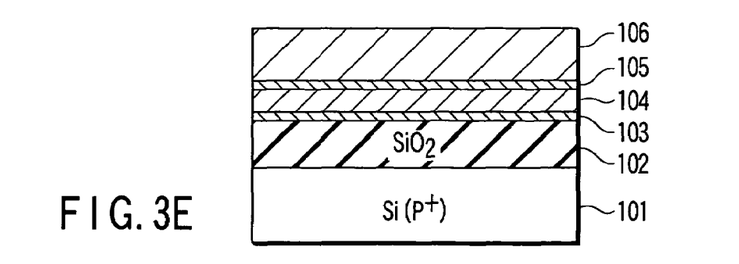

Then, mono-silane gas is supplied again at a predetermined flow rate into the reaction container 2 from the mono-silane gas supply source 61 (supply of mono-germane gas and hydrogen gas is stopped), so that the interior of the reaction container 2 is maintained at a predetermined vacuum atmosphere. By doing so, a cap film 106 made of, e.g., poly-silicon is formed to a predetermined thickness on the coating film 105, as shown in FIG. 3E (step S8). Then, while the temperature of the process field within the reaction container 2 is decreased to, e.g., the first temperature of 530%, nitrogen gas is supplied through the injector 92 to purge the reaction container 2 and return the reaction container 2 to normal pressure (supply of the other gases is stopped).

Then, the wafer boat 4 is unloaded from the reaction container 2 (step S9), and is transferred to another apparatus for, e.g., ion implantation. A carrier impurity element, such as phosphorous (P) or boron (B), is implanted into the silicon germanium film 104 through the poly-silicon film 106 by ion implantation. By doing so, a structure is formed to have the silicon oxide film 102 and silicon germanium film 104 as a gate insulating film and gate electrode, respectively.

In the process described above, after the silicon germanium film 104 is formed, the temperature is increased to a film-formation temperature for the cap film 106 made of, e.g., poly-silicon. At this time, as shown in FIG. 4, thermally unstable germanium is apt to move around with an increase in temperature, thereby causing migration in the film. However, according to the first embodiment, during this temperature increase, mono-silane gas is supplied into the reaction container 2. This brings about a state in which deposition of mono-silane causes the surface of the silicon germanium film 104 to be pressed, and thereby suppresses movement of the film. As a consequence, as shown in experimental examples described later, generation of voids decreases, and the surface roughness is reduced. It follows that the leakage current from the gate electrode decreases and the yield is improved. In other words, the semiconductor device or transistor can have better electrical properties.

Start of supply of mono-silane gas for forming the coating film 105 may be at a delayed timing, such that, e.g., the gas is not supplied until the temperature increases to a certain value from start of heating up. However, the mono-silane gas needs to be supplied during the temperature increase up to the second temperature. Supply of the mono-silane gas may be stopped when the temperature reaches the second temperature, as described above. Alternatively, supply of the mono-silane gas may be stopped some time (at a delayed timing) after the temperature reaches the second temperature. Alternatively, supply of the mono-silane gas may be stopped in the middle of the temperature increase. The timings to start and stop supply of the mono-silane gas are determined in accordance with the thickness of the coating film 105. If the coating film 105 is too thick, the cap film 106 formed on the silicon germanium film 102 will have lower uniformity in film thickness and film quality.

The silane family gas is not limited to mono-silane gas, and it may be a gas selected from the following materials: disilane ($Si_2H_6$), dichloro silane ($SiH_2Cl_2$), tetrachloro silane ($SiCl_4$), hexachloro silane ($Si_2Cl_6$), hexaethylamino disilane, hexamethyl disilazane, disilylamine, trisilylamine, and bistertialbutylamino silane.

For example, the average heating-up rate from the first temperature to the second temperature is preferably set at 30° C./minute or more. As shown in experimental examples described later, if the average heating-up rate is too low, the cap film 106 decreases planar uniformity in film thickness.

Second Embodiment

The second embodiment is directed to a case where a target substrate is unloaded from a reaction container 2 with no cap film being formed after a silicon germanium film is formed. For example, the second embodiment may be applied to a case where the surface portion of a silicon germanium film is turned into silicide by nickel in order to use the silicon germanium film as a gate electrode. A film-formation method according to the second embodiment may be performed in the same apparatus as that shown in FIG. 1.

Figure 5:
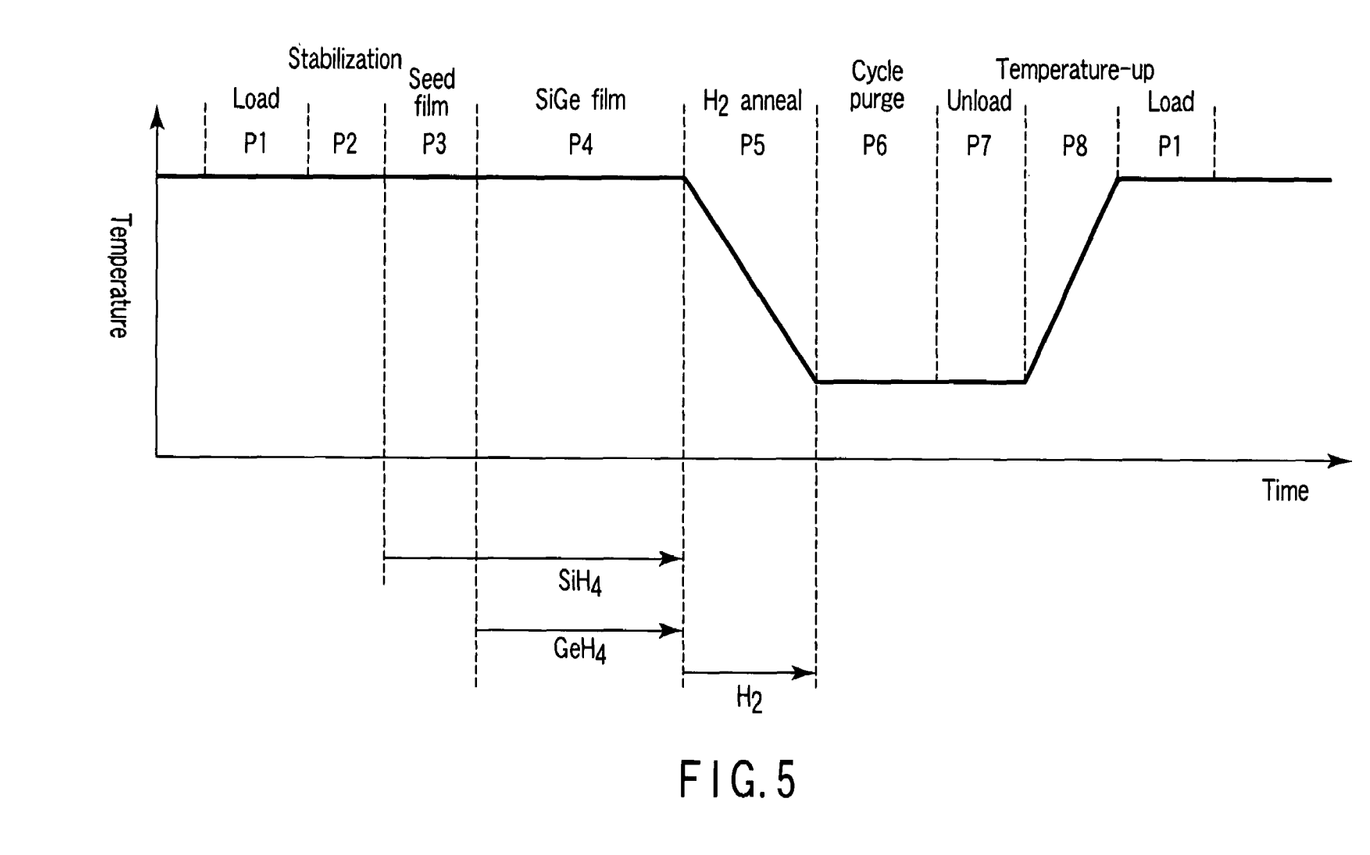
FIG. 5 is a view showing the temperature profile, steps, and feed process gases of a film-formation method according to a second embodiment of the present invention.

FIG. 5 is a view showing the temperature profile, steps, and feed process gases of a film-formation method according to the second embodiment of the present invention. The method shown in FIG. 5 proceeds with steps until a film-formation step P4 of a silicon germanium film, which are the same as those until the film-formation step S4 of the first embodiment.

Specifically, wafers W are prepared such that they include a silicon oxide film formed on the surface as a gate insulating film. The wafers W are placed on a wafer boat 4, which is then loaded into the reaction container 2 (step P1). Then, the temperature of the process field within the reaction container 2 is stabilized (step P2). Then, mono-silane gas used as a silane family gas is supplied into the reaction container 2 to form a seed film made of amorphous silicon (step P3). Then, mono-silane gas and mono-germane gas are supplied into the reaction container 2 to form a silicon germanium film (step P4). The silicon germanium film is formed at a film-formation temperature (process temperature) of, e.g., from 470 to 550%.

Then, the temperature of the process field within the reaction container 2 is decreased to e.g., 400% from the film-formation temperature of from 470 to 550%. During this temperature decrease, hydrogen gas is supplied into the reaction container 2 at a flow rate of, e.g., 1000 sccm to anneal the silicon germanium film (step P5). At this time, the reaction container 2 is exhausted to set the interior of the reaction container 2 at a vacuum atmosphere of, e.g., 1000 Pa.

Then, the valve of the pressure regulator 24 is fully opened to exhaust the reaction container 2 at full load, so as to vacuum-exhaust hydrogen gas (supply of all the gases is stopped). Then, an inactive gas used as a purge gas, such as nitrogen gas, is supplied through the injector 91 to purge the reaction container 2. This vacuum-exhaust/purging is repeated a plurality of times to thereby perform cycle purge (step P6).

After the interior of the reaction container 2 is replaced with nitrogen gas to return it to normal pressure, the wafer boat 4 is unloaded (step P7). Then, the interior of the reaction container 2 is heated up to a process temperature for processing subsequent wafers W (step P8). Thereafter, a wafer boat 4 holding the subsequent wafers W is loaded into the reaction container 2 (step P1).

According to the second embodiment, after the silicon germanium film is formed, the silicon germanium film is annealed using hydrogen gas, and then the cycle purge is performed. As a consequence, as shown in experimental examples described later, migration in the silicon germanium film is suppressed during vacuum-exhaust, and the surface roughness of the film is reduced. This is thought to occur because hydrogen couples with dangling bonds of silicon or germanium and thereby terminates them on the surface of the silicon germanium film, so the surface is stabilized. As a consequence, for example, the leakage current is reduced and better properties are obtained in a MOSFET with a silicon germanium film and a wiring layer formed thereon.

Further, the cycle purge is performed after the process field within the reaction container 2 is cooled from the film-formation temperature. When the silicon germanium film is exposed to a low pressure atmosphere (high-vacuum level atmosphere) obtained by vacuum-exhaust at full load, the temperature is low and thus the migration less likely occurs. In this case, the temperature of the process field is preferably cooled to, e.g., 400° C. or less. Furthermore, since the temperature decrease step of the process field and annealing step using hydrogen gas are simultaneously performed, a high throughput can be obtained.

The annealing with hydrogen gas may be performed as a part of the temperature decrease step. For example, after the silicon germanium film is formed, the annealing is performed, but supply of hydrogen gas may be stopped before the temperature decrease step is completed. Further, the annealing with hydrogen gas may be performed at a temperature used for forming the silicon germanium film. In this case, the cycle purge may be performed at a temperature used for the annealing, or performed while the temperature is being decreased.

Third Embodiment

The third embodiment is directed to a case where a wafer is unloaded from a reaction container 2 after an amorphous silicon film is formed thereon. For example, the third embodiment may be applied to a case where an amorphous silicon film is used for a capacitor device, or an amorphous silicon film is formed as a seed film and then the wafer is unloaded from the reaction container 2 (for example, in order to examine the silicon germanium film). A film-formation method according to the third embodiment may be performed in the same apparatus as that shown in FIG. 1, but the mono-germane gas supply section is not necessarily required.

Figure 6:
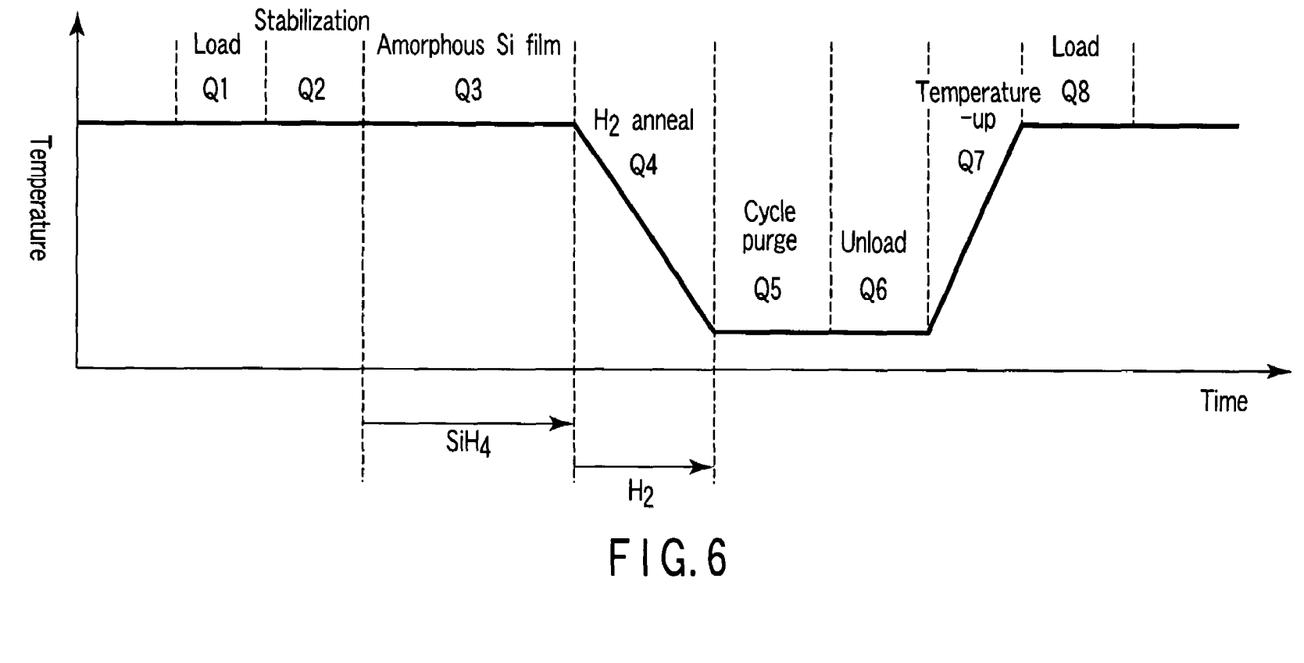
FIG. 6 is a view showing the temperature profile, steps, and feed process gases of a film-formation method according to a third embodiment of the present invention.

FIG. 6 is a view showing the temperature profile, steps, and feed process gases of a film-formation method according to the third embodiment of the present invention. In the method shown in FIG. 6, wafers W are placed in a wafer boat 4, which is then loaded into the process field within the reaction container 2 already set at a process temperature (step Q1). Then, the temperature of the process field within the reaction container 2 is stabilized at the process temperature of, e.g., 530° C. (step Q2). Then, mono-silane gas used as a silane family gas is supplied at a predetermined flow rate, and the interior of the reaction container 2 is set at a predetermined pressure, to form an amorphous silicon film (step Q3).

Then, the temperature of the process field within the reaction container 2 is decreased to e.g., 400% from the film-formation temperature of 530%. During this temperature decrease, hydrogen gas is supplied into the reaction container 2 at a flow rate of, e.g., 1000 sccm to anneal the amorphous silicon film (step Q4). At this time, the reaction container 2 is exhausted to set the interior of the reaction container 2 at a vacuum atmosphere of, e.g., 1000 Pa.

Then, the valve of the pressure regulator 24 is fully opened to exhaust the reaction container 2 at full load, so as to vacuum-exhaust hydrogen gas (supply of all the gases is stopped). Then, an inactive gas used as a purge gas, such as nitrogen gas, is supplied through the injector 91 to purge the reaction container 2. This vacuum-exhaust/purging is repeated a plurality of times to thereby perform cycle purge (step Q5).

After the interior of the reaction container 2 is replaced with nitrogen gas to return it to normal pressure, the wafer boat 4 is unloaded (step Q6). Then, the process field within the reaction container 2 is heated up to a process temperature for processing subsequent wafers W (step Q7). Thereafter, a wafer boat 4 holding the subsequent wafers W is loaded into the reaction container 2 (step Q1).

According to the third embodiment, after the amorphous silicon film is formed, the amorphous silicon film is annealed using hydrogen gas, while the temperature is being decreased, and then the cycle purge is performed. As a consequence, as shown in experimental examples described later, migration in the amorphous silicon film is suppressed during vacuum-exhaust, and the surface roughness of the film is reduced. As a consequence, for example, where the amorphous silicon film is used as a cap film for the silicon germanium film, or it is applied to a capacitor device, the leakage current is reduced. It follows that the electrical properties of a semiconductor device including the amorphous silicon film can be improved.

Further, since the temperature decrease step of the process field within the reaction container 2 and annealing step using hydrogen gas are simultaneously performed, a high throughput can be obtained. Furthermore, the cycle purge is performed at a low temperature, and thus the migration less likely occurs. The mechanism behind suppressing the migration is thought to be same as that for the silicon germanium film. This method according to the third embodiment is effective particularly to a case where the amorphous silicon film is thin, e.g., 50 nm or less.

Figure 11:
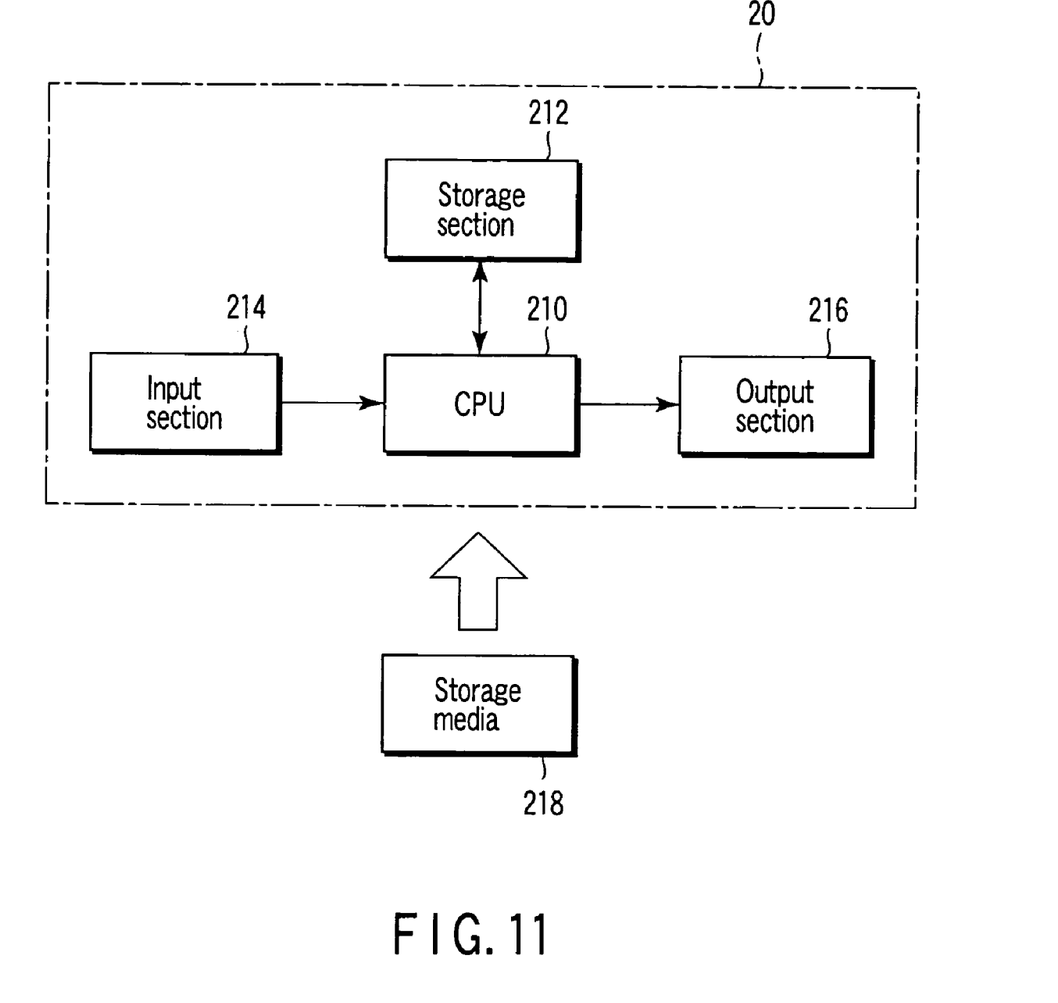
FIG. 11 is a block diagram schematically showing the structure of a control section.

Each of the methods according to the first to third embodiments is performed under the control of the control section 20 in accordance with a process program, as described above. FIG. 11 is a block diagram schematically showing the structure of the control section 20. The control section 20 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 11 also shows a storage medium or media 218 attached to the computer in a removable state.

Each of the methods according to the first to third embodiments may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

In the second and third embodiments, a step of setting the valve of the pressure regulator 24 fully open to exhaust the reaction container 2 at full load, and a step of supplying a purge gas are repeated a plurality of times, in order to replace the interior of the reaction container 2 with the purge gas. However, each of these steps may be performed only once.

In the first embodiment, the silicon germanium film is supplied with a carrier impurity element by ion implantation to form a gate electrode. Alternatively, the silicon germanium film may be doped with phosphorous or boron by supplying a dopant gas, such as phosphine gas or boron trichloride gas, in film formation. In this case, for example, the film-formation apparatus 1 may be provided with one dopant gas supply line to supply a dopant gas from below the wafer boat 4.

Film-formation methods according to the first to third embodiments are not solely performed in a film-formation apparatus of the batch type. They may be applied to a film-formation apparatus of the single-substrate type for processing substrates one by one. The methods described above could be used to produce a poly-silicon germanium film or amorphous silicon germanium film, as a silicon germanium film.

EXPERIMENT

Present Example 1

As shown in FIGS. 3A to 3E, silicon wafers were first prepared such that they included an N-type silicon film and a silicon oxide film used as an insulating film formed on the surface of the silicon film. Using the film-formation apparatus 1 shown in FIG. 1, the wafers were processed such that a seed film made of amorphous silicon was formed thereon to have a thickness of 10 nm, and then an amorphous silicon germanium film was formed to have a thickness of 50 nm. Then, during a temperature increase step and a following temperature stabilization step (5 minutes), mono-silane gas was supplied into the reaction container to cover the surface of the silicon germanium film with a coating film made of silicon and having a thickness of 10 nm or more. Then, the wafers were annealed using hydrogen gas, and then a poly-silicon film was formed on the coating film.

The process conditions for the silicon germanium film were set, as follows.
 Set temperature: 490° C.
 Set pressure: 40 Pa.
 Set flow rate of mono-silane gas: 1000 sccm.
 Set flow rate of mono-germane gas: 1000 sccm.
The process conditions for the coating film were set, as follows.
 Heating-up rate: three different values of 5° C./minute, 10° C./minute, and 30° C./minute.
 Set pressure: 10 Pa.
 Set flow rate of mono-silane gas: 500 sccm.
 Film thickness: 10 nm or more.
The mono-germane gas set out in the process conditions was a gas diluted to 10% by hydrogen gas.

Comparative Example 1

Film formation was performed in the same manner as the present example 1, except that no coating film 105 was formed on the silicon germanium film 104.

[Result and Examination]

Figure 7A:
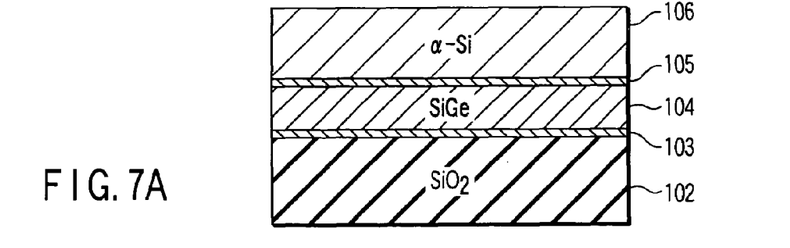
FIGS. 7A and 7B are views showing the cross section of multi-layered bodies according to a present example 1 and a comparative example 1, respectively, observed by a TEM (transmission electron microscope)
Figure 7B:
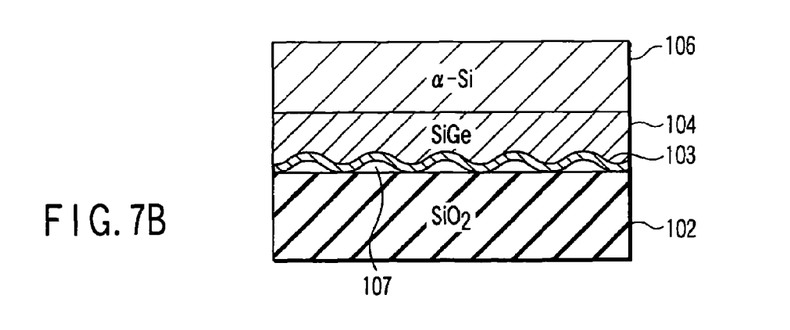

FIGS. 7A and 7B are views showing the cross section of multi-layered bodies according to the present example 1 and comparative example 1, respectively, observed by a TEM (transmission electron microscope). In the present example 1, the silicon germanium film 104, amorphous silicon film 103 used as a seed film, and silicon oxide film 102 were in close contact with each other, without any void being observed. In the comparative example 1, many voids 107 formed were observed at the interface between the amorphous silicon film 103 and silicon oxide film 102. Accordingly, it has been confirmed that a method of depositing a silicon film on the surface of the silicon germanium film 104 during temperature increase is effective in suppressing migration in the silicon germanium film 104.

Figure 8:
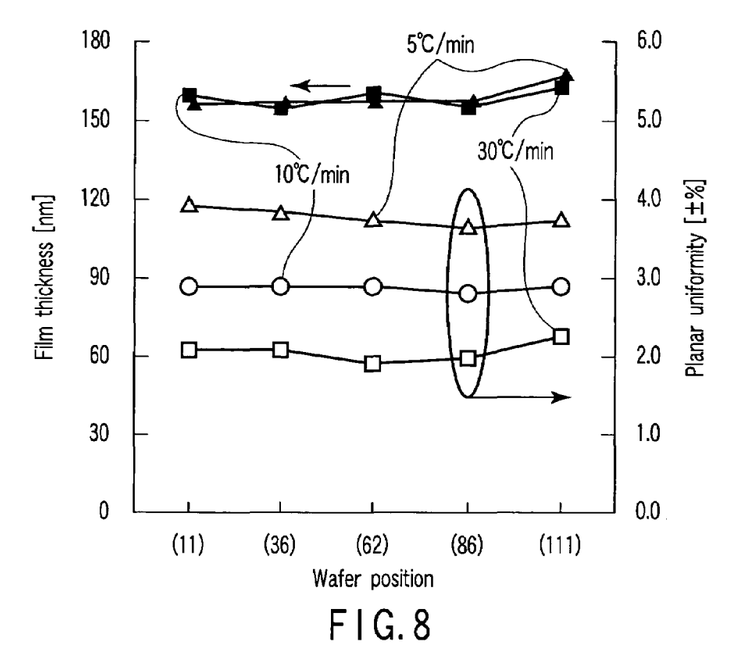
FIG. 8 is a graph showing the relationship of the film thickness of a silicon germanium film and planar uniformity thereof relative to wafer position, obtained by an experiment.

Another experiment was conducted as to how the film thickness of the cap film and planar uniformity thereof would change with variation in the heating-up rate (average heating-up rate). FIG. 8 is a graph showing the relationship of the film thickness of the silicon germanium film and planar uniformity thereof relative to wafer position, obtained by this experiment. In FIG. 8, the horizontal axis denotes numbers of slot positions of the wafer boat, in which a slot position is located on a lower side as its number symbol is higher. As shown in FIG. 8, the film thickness and planar uniformity were better as the heating-up rate was higher. Judging from this result, it is thought that the heating-up rate is preferably set at 30° C./minute or more when the temperature is increased while mono-silane gas is supplied.

Present Example 2

Using the film-formation apparatus 1 shown in FIG. 1, a silicon germanium film was formed on the surface of silicon wafers. The process conditions for the silicon germanium film were set, as follows.
 Set temperature: 490° C.
 Set pressure: 40 Pa.
 Set flow rate of mono-silane gas: 1000 sccm.
 Set flow rate of mono-germane gas: 1000 sccm.
 Target film thickness: 50 nm.

Then, the temperature of the process field within the reaction container was decreased from 490% to 400%. During this temperature decrease, hydrogen gas was supplied at a flow rate of 1000 sccm into the reaction container, and the pressure of the process field was set at 1000 Pa. The temperature decreasing rate of the process field was set at an average rate of 10° C./minute. Then, cycle purge was performed by repeating, three times, a step of vacuum-exhausting the reaction container, and a step of purging the reaction container with nitrogen gas. Then, the wafers were unloaded from the reaction container.

Comparative Example 2

A silicon germanium film was formed under the same conditions as the present example 2. Then, cycle purge was performed with $N_2$ gas at the film-formation temperature, without performing temperature decrease or hydrogen gas annealing, and then the wafer was unloaded from the reaction container.

[Result of Surface Observation]

Figure 9A:
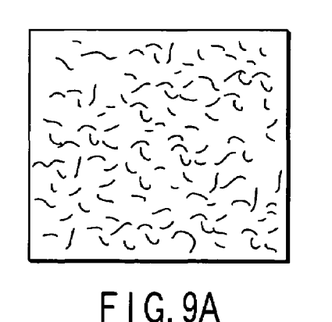
FIGS. 9A and 9B are views showing the surface state of a silicon germanium film according to a present example 2 and a comparative example 2, respectively.
Figure 9B:
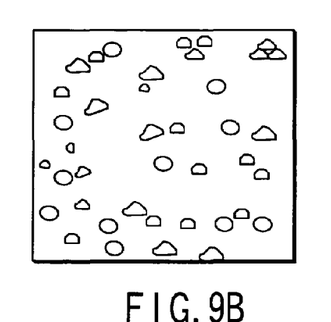

The surface of the silicon germanium film obtained by each of the present example 2 and comparative example 2 was observed by an SEM (Scanning Electron Microscope). FIGS. 9A and 9B are views showing the surface state of the silicon germanium films according to the present example 2 and comparative example 2, respectively. In the present example 2, the surface was smooth, as shown in FIG. 9A. By contrast, in the comparative example 2, the surface was very rough with groups of granular projections observed, as shown in FIG. 9B. Since the cycle purge was performed at a higher temperature in the comparative example 2, there may have been a difference in the degree of migration in the silicon germanium film between the present example 2 and comparative example 2. However, the surface morphology was considered to have been greatly improved because of the annealing process with hydrogen gas. Accordingly, it has been found that, the annealing process with hydrogen gas is very effective in suppressing migration in the silicon germanium film during subsequent vacuum-exhaust.

Present Example 3

Using the film-formation apparatus 1 shown in FIG. 1, an amorphous silicon film was formed on the surface of silicon wafers. Then, the same process as present example 2 was performed, except that the temperature within the reaction container was cooled from 530° C. to 400° C. The process conditions for the amorphous silicon film were set, as follows.

Set temperature: 530° C.
Set pressure: 40 Pa.
Set flow rate of mono-silane gas: 1000 sccm.
Target film thickness: 50 nm.

Comparative Example 3

An amorphous silicon film was formed under the same conditions as the present example 3. Then, cycle purge was performed with $N_2$ gas at the film-formation temperature, without performing temperature decrease or hydrogen gas annealing, and then the wafer was unloaded from the reaction container.

[Result of Surface Observation]

The surface of the silicon germanium film obtained by each of the present example 3 and comparative example 3 was observed by an SEM (Scanning Electron Microscope). They showed a difference similar to that between the present example 2 and comparative example 2. Accordingly, it has been found that, the annealing process with hydrogen gas is very effective to suppress migration in the amorphous silicon film during subsequent vacuum-exhaust.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film-formation method for a semiconductor process, comprising:
    forming a silicon germanium film on a target substrate by CVD in a process field within a reaction container, while setting the process field at a first temperature, and supplying a first process gas of a silane family and a second process gas of a germane family into the process field,
    then, forming a silicon coating film to cover the silicon germanium film by CVD in the process field, while increasing temperature of the process field from the first temperature to a second temperature, supplying the first process gas into the process field, and stopping supply of the second process gas; and
    then, forming a silicon film on the coating film by CVD in the process field, while setting the process field at the second temperature, supplying the first process gas into the process field, and stopping supply of the second process gas,
    wherein the method further comprising, after forming the coating film and before forming the silicon film, annealing the coating film in the process field, while setting the process field at a temperature higher than the first temperature, supplying hydrogen gas into the process field, and stopping the supply of the first and second process gases.

2. The method according to claim 1, wherein in annealing the coating film, the process field is set at a temperature substantially the same as the second temperature.

3. The method according to claim 1, wherein the coating film has a thickness of from 5 to 10 nm.

4. The method according to claim 1, wherein temperature increase from the first temperature to the second temperature is set at an average heating-up rate of 30° C./minute or more.

5. The method according to claim 1, further comprising, before forming the silicon germanium film, forming a silicon seed film on the target substrate by CVD in the process field, while setting the process field at a temperature lower than the second temperature, supplying the first process gas into the process field, and stopping supply of the second process gas, wherein the silicon germanium film is formed on the seed film.

6. The method according to claim 5, wherein in forming the seed film, the process field is set at a temperature substantially the same as the first temperature.

7. The method according to claim 5, wherein the seed film is formed on an insulating film disposed on the target substrate.

8. The method according to claim 5, further comprising, after forming the silicon film, ion-implanting a carrier impurity into the silicon germanium film through the silicon film.

9. The method according to claim 8, wherein the insulating film and the silicon germanium film are a gate insulating film and a gate electrode, respectively.

10. A film-formation method for a semiconductor process, comprising:
    forming a silicon germanium film on a target substrate by CVD in a process field within a reaction container, while setting the process field at a first temperature, and supplying a first process gas of a silane family and a second process gas of a germane family into the process field,
    then, forming a silicon coating film to cover the silicon germanium film by CVD in the process field, while increasing temperature of the process field from the first temperature to a second temperature, supplying the first process gas into the process field, and stopping supply of the second process gas; and
    then, forming a silicon film on the coating film by CVD in the process field, while setting the process field at the second temperature, supplying the first process gas into the process field, and stopping supply of the second process gas,
    wherein the coating film has a thickness of from 5 to 10 nm.

11. The method according to claim 10, wherein temperature increase from the first temperature to the second temperature is set at an average heating-up rate of 30° C./minute or more.

12. The method according to claim 11, further comprising, after forming the coating film and before forming the silicon film, annealing the coating film in the process field, while setting the process field at a temperature higher than the first temperature, supplying hydrogen gas into the process field, and stopping the supply of the first and second process gases.

13. A film-formation method for a semiconductor process, comprising:
    forming a silicon germanium film on a target substrate by CVD in a process field within a reaction container, while setting the process field at a first temperature, and supplying a first process gas of a silane family and a second process gas of a germane family into the process field,
    then, forming a silicon coating film to cover the silicon germanium film by CVD in the process field, while increasing temperature of the process field from the first temperature to a second temperature, supplying the first process gas into the process field, and stopping supply of the second process gas; and then, forming a silicon film on the coating film by CVD in the process field, while setting the process field at the second temperature, supplying the first process gas into the process field, and stopping supply of the second process gas, wherein the method further comprising, before forming the silicon germanium film, forming a silicon seed film on the target substrate by CVD in the process field, while setting the process field at a temperature lower than the second temperature, supplying the first process gas into the process field, and stopping supply of the second process gas, wherein the silicon germanium film is formed on the seed film, wherein in forming the seed film, the process field is set at a temperature substantially the same as the first temperature.

14. A film-formation method for a semiconductor process, comprising:

forming a silicon germanium film on a target substrate by CVD in a process field within a reaction container, while setting the process field at a first temperature, and supplying a first process gas of a silane family and a second process gas of a germane family into the process field, then, forming a silicon coating film to cover the silicon germanium film by CVD in the process field, while increasing temperature of the process field from the first temperature to a second temperature, supplying the first process gas into the process field, and stopping supply of the second process gas; and then, forming a silicon film on the coating film by CVD in the process field, while setting the process field at the second temperature, supplying the first process gas into the process field, and stopping supply of the second process gas, further comprising, before forming the silicon germanium film, forming a silicon seed film on the target substrate by CVD in the process field, while setting the process field at a temperature lower than the second temperature, supplying the first process gas into the process field, and stopping supply of the second process gas, wherein the silicon germanium film is formed on the seed film, wherein the seed film is formed on an insulating film disposed on the target substrate.

15. The method according to claim 14, further comprising, after forming the silicon film, ion-implanting a carrier impurity into the silicon germanium film through the silicon film.

16. The method according to claim 15, wherein the insulating film and the silicon germanium film are a gate insulating film and a gate electrode, respectively.

* * * * *